US012211675B2

(12) United States Patent
Kim et al.

(10) Patent No.: US 12,211,675 B2
(45) Date of Patent: Jan. 28, 2025

(54) APPARATUS FOR TREATING SUBSTRATE AND METHOD FOR TREATING A SUBSTRATE

(71) Applicant: SEMES CO., LTD., Cheonan-si (KR)

(72) Inventors: Ji Hun Kim, Pohang-si (KR); Hyung Joon Kim, Pyeongtaek-si (KR)

(73) Assignee: Semes Co., Ltd., Cheonan-si (KR)

( * ) Notice: Subject to any disclaimer, the term of this patent is extended or adjusted under 35 U.S.C. 154(b) by 112 days.

(21) Appl. No.: 18/050,711

(22) Filed: Oct. 28, 2022

(65) Prior Publication Data
US 2023/0140253 A1  May 4, 2023

(30) Foreign Application Priority Data

Nov. 2, 2021  (KR) .................. 10-2021-0148457

(51) Int. Cl.
*H01J 37/00* (2006.01)
*H01J 37/32* (2006.01)
*H01L 21/3065* (2006.01)

(52) U.S. Cl.
CPC .. *H01J 37/32834* (2013.01); *H01J 37/32449* (2013.01); *H01L 21/3065* (2013.01)

(58) Field of Classification Search
CPC . H01L 21/205; H01L 21/302; H01L 21/3065; H01L 21/31; H01L 21/365;

(Continued)

(56) References Cited

U.S. PATENT DOCUMENTS

2013/0313458 A1  11/2013  Kouketsu et al.
2014/0087564 A1*  3/2014  Shimizu ............ H01J 37/32091
                                                           156/345.51

(Continued)

FOREIGN PATENT DOCUMENTS

JP  2002-016044 A  1/2002
JP  2002-113355 A  4/2002

(Continued)

OTHER PUBLICATIONS

Japanese Office Action dated Dec. 5, 2023 for corresponding Japanese Patent Application No. 2022-175274.

(Continued)

*Primary Examiner* — Tuan T Lam
(74) *Attorney, Agent, or Firm* — HARNESS, DICKEY & PIERCE, P.L.C.

(57) ABSTRACT

The inventive concept provides a substrate treating apparatus. The substrate treating apparatus includes a housing having a treating space for treating a substrate; a support unit configured to support the substrate at the treating space; and a plasma source for generating a plasma from a process gas supplied into the treating space; an exhaust line connecting to the housing and exhausting an atmosphere of the treating space; and a pressure adjusting unit positioned between the support unit and the exhaust line and configured to adjust an exhaust pressure exhausted from the exhaust line, and wherein the pressure adjusting unit includes: an opening/closing member for opening and closing the exhaust line; a lifting/lowering member for moving the opening/closing member in an up/down direction; and an elastic member for providing a restoring force to the lifting/lowering member.

10 Claims, 11 Drawing Sheets

(58) Field of Classification Search
CPC ..... H01L 21/461; H01L 21/469; H01L 21/86; H01K 37/32834
See application file for complete search history.

(56) References Cited

U.S. PATENT DOCUMENTS

| | | |
|---|---|---|
| 2019/0080888 A1 | 3/2019 | Ikenaga et al. |
| 2023/0145538 A1* | 5/2023 | Lee .................. H01J 37/32715 156/345.51 |
| 2024/0047180 A1* | 2/2024 | Hara ....................... C23C 16/42 |

FOREIGN PATENT DOCUMENTS

| | | |
|---|---|---|
| JP | 2013-089730 A | 5/2013 |
| JP | 2019-054234 A | 4/2019 |
| JP | 7073998 B2 | 5/2022 |
| KR | 10-2011-0043241 A | 4/2011 |
| KR | 10-2018-0014898 A | 2/2018 |
| WO | WO-2012/105109 A1 | 8/2012 |
| WO | WO-2014049915 A1 | 4/2014 |

OTHER PUBLICATIONS

Korean Office Action, dated Aug. 21, 2023, issued in corresponding Korean Patent Application No. 10-2021-0148457.

* cited by examiner

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2021-0148457 filed on Nov. 2, 2021, in the Korean Intellectual Property Office, the entire contents of which are hereby incorporated by reference.

BACKGROUND

Embodiments of the inventive concept described herein relate to a substrate treating apparatus, more specifically, a substrate treating apparatus for plasma treating a substrate.

A plasma refers to an ionized gas state composed of ions, radicals, and electrons. The plasma is produced by a very high temperatures, a strong electric field, or a high frequency electromagnetic field (RF electromagnetic field). A semiconductor device manufacturing process may include an etching process of removing a thin film formed on a substrate such as a wafer using the plasma. The etching process is performed by colliding ions and/or radicals of the plasma with the thin film on the substrate or reacting with the thin film.

When treating the substrate using the plasma inside the process chamber, an inner pressure of the process chamber should be appropriately adjusted. The inner pressure of the process chamber is adjusted by exhausting an atmosphere inside the process chamber through an exhaust line. In order to precisely adjust the atmosphere inside the process chamber, it is essential to appropriately adjust an opening degree of the exhaust line, and to this end, a plurality of driving members moving opening/closing members for opening and closing the exhaust line are required. This leads to a structural complexity of the substrate treating apparatus. In addition, opening/closing members installed inside the exhaust line to block the inside of the exhaust line or adjust an inner opening degree of the exhaust line are frequently maintained due to particles or process byproducts flowing inside the exhaust line. This leads to a problem of a lowered substrate treating efficiency.

SUMMARY

Embodiments of the inventive concept provide a substrate treating apparatus and method for effectively adjusting an inner pressure of a treating space.

Embodiments of the inventive concept provide a substrate treating apparatus and method for efficiently exhausting process by-products flowing in a treating space.

Embodiments of the inventive concept provide a substrate treating apparatus and method for minimizing a structural complexity.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space for treating a substrate; a support unit configured to support the substrate at the treating space; and a plasma source for generating a plasma from a process gas supplied into the treating space; an exhaust line connecting to the housing and exhausting an atmosphere of the treating space; and a pressure adjusting unit positioned between the support unit and the exhaust line and configured to adjust an exhaust pressure exhausted from the exhaust line, and wherein the pressure adjusting unit includes: an opening/closing member for opening and closing the exhaust line; a lifting/lowering member for moving the opening/closing member in an up/down direction; and an elastic member for providing a restoring force to the lifting/lowering member.

In an embodiment, opening/closing member includes: a base plate formed to cover the exhaust line when seen from above; and a stopper member extending from a bottom end of the base plate and having a diameter which is the same or smaller than a diameter of the exhaust line.

In an embodiment, the elastic member connects a bottom end of the support unit and a top end of the base plate.

In an embodiment, the elastic member is provided in a plurality, and the plurality of elastic member are positioned at regular intervals based on a center of the base plate.

In an embodiment, the lifting/lowering member includes: a body combined to a bottom end of the support unit, having an inner space, and storing a fluid in the inner space; a lifting/lowering rod having an end combining with the opening/closing member and moving in the up/down direction due to a fluid of the inner space; and a fluid supply unit configured to supply the fluid to the inner space.

In an embodiment, the apparatus further includes a controller for controlling the lifting/lowering member, and wherein the controller controls the lifting/lowering member so a relative height between the opening/closing member and a top end of the exhaust line is changed by an adjusting of a supply amount of the fluid supplied to the inner space.

In an embodiment, the controller controls the lifting/lowering member to supply the fluid to the inner space, if the opening/closing member moves in a downward direction, and controls the lifting/lowering member so the elastic member provides the restoring force to the lifting/lowering member by stopping a supply of the fluid in the inner space, if the opening/closing member moves in an upward direction.

In an embodiment, the pressure adjusting unit further comprises a position sensor installed at a bottom end of the support unit and measuring a position information of the opening/closing member by measuring a height from a bottom end of the support unit to the top end of the opening/closing member, and wherein the controller controls the lifting/lowering member so a relative height between a bottom end of the opening/closing member and a top end of the exhaust line is changed based on an opening degree of the exhaust line, which is measured by a height of the opening/closing member measured by the position sensor.

In an embodiment, the lifting/lowering member is installed at a center of the opening/closing member.

The inventive concept provides a substrate treating apparatus. The substrate treating apparatus includes a housing having a treating space for treating a substrate; a support unit configured to support the substrate at the treating space; a gas supply unit configured to supply a process gas to the treating space; a plasma source for exciting a plasma from the process gas; an exhaust line connecting to a bottom end of the housing and exhausting an atmosphere of the treating space; and a pressure adjusting unit positioned between the support unit and the exhaust line and configured to adjust an exhaust pressure exhausted from the exhaust line, and wherein the pressure adjusting unit includes: an opening/closing member for opening and closing the exhaust line; a lifting/lowering member for moving the opening/closing member in an up/down direction; and an elastic member for providing a restoring force to the lifting/lowering member, and wherein the opening/closing member includes: a base plate formed to cover the exhaust line when seen from above; and a stopper member extending from a bottom end of the base plate and having a diameter which is the same or smaller than a diameter of the exhaust line, and wherein the elastic member connects a bottom end of the support unit and a top end of the base plate.

In an embodiment, the elastic member is provided in a plurality, and positioned at regular intervals based on a center of the base plate.

In an embodiment, the lifting/lowering member includes: a body combined to the bottom end of the support unit, having an inner space, and storing a fluid in the inner space; a lifting/lowering rod having an end combining with the opening/closing member and moving in the up/down direction due to the fluid of the inner space; and a fluid supply unit configured to supply the fluid to the inner space.

In an embodiment, the substrate treating apparatus further includes a controller for controlling the lifting/lowering member, and wherein the pressure adjusting unit further comprises a position sensor installed at the bottom end of the support unit and measuring a position information of the opening/closing member by measuring a height from the bottom end of the support unit to a top end of the opening/closing member, and wherein the controller controls the lifting/lowering member so a relative height between a bottom end of the opening/closing member and a top end of the exhaust line is changed based on an opening degree of the exhaust line, which is measured by a height of the opening/closing member measured by the position sensor.

In an embodiment, the controller controls the lifting/lowering member to supply the fluid to the inner space, if the opening/closing member moves in a downward direction, and controls the lifting/lowering member so the elastic member provides the restoring force to the lifting/lowering member by stopping a supply of the fluid in the inner space, if the opening/closing member moves in an upward direction.

The inventive concept provides a substrate treating method. The substrate treating method includes performing a plasma treatment on a substrate by taking-in the substrate to a treating space, and exhausting an atmosphere of the treating space to adjust an inner pressure of the treating space; taking-out the substrate treating the treating space after the performing is completed; and exhausting the atmosphere of the treating space, and wherein at the performing, the inner pressure of the treating space is adjusted by adjusting an opening degree of an exhaust line for exhausting the atmosphere of the treating space, and at the exhausting, the atmosphere of the treating space is exhausted by closing the exhaust line.

In an embodiment, an atmosphere adjusting of the treating space is performed by the pressure adjusting unit, and the pressure adjusting unit includes: an opening/closing member for opening and closing the exhaust line; a lifting/lowering member for moving the opening/closing member in an up/down direction by a fluid; and an elastic member for providing a restoring force to the lifting/lowering member.

In an embodiment, the performing further comprises adjusting a supply amount of a fluid supplied to the lifting/lowering member to change a relative height between the opening/closing member and a top end of the exhaust line.

In an embodiment, the performing further comprises changing a relative height between a bottom end of the opening/closing member and a top end of the exhaust line based on the opening degree of the exhaust line, which is measured by measuring a current height of the opening/closing member and calculating the opening degree of the exhaust line is calculated based on the height information.

In an embodiment, the fluid is supplied to the lifting/lowering member to move the opening/closing member in a downward direction, if the inner pressure of the treating space is increased, and the opening/closing member is moved in an upward direction by providing the restoring force to the lifting/lowering member by the elastic member by adjusting a supply amount of the fluid to the lifting/lowering member, if the inner pressure of the treating space is decreased.

In an embodiment, the exhausting completely opens the exhaust line by moving the opening/closing member in an upward direction by providing the restoring force to the lifting/lowering unit by the elastic member and stopping a supply of the fluid to the lifting/lowering member.

According to an embodiment of the inventive concept, an inner pressure of an treating space may be effectively adjusted.

According to an embodiment of the inventive concept, process by-products flowing in a treating space may be efficiently exhausted.

According to an embodiment of the inventive concept, a structural complexity of an apparatus may be minimized to effectively perform a maintenance work.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
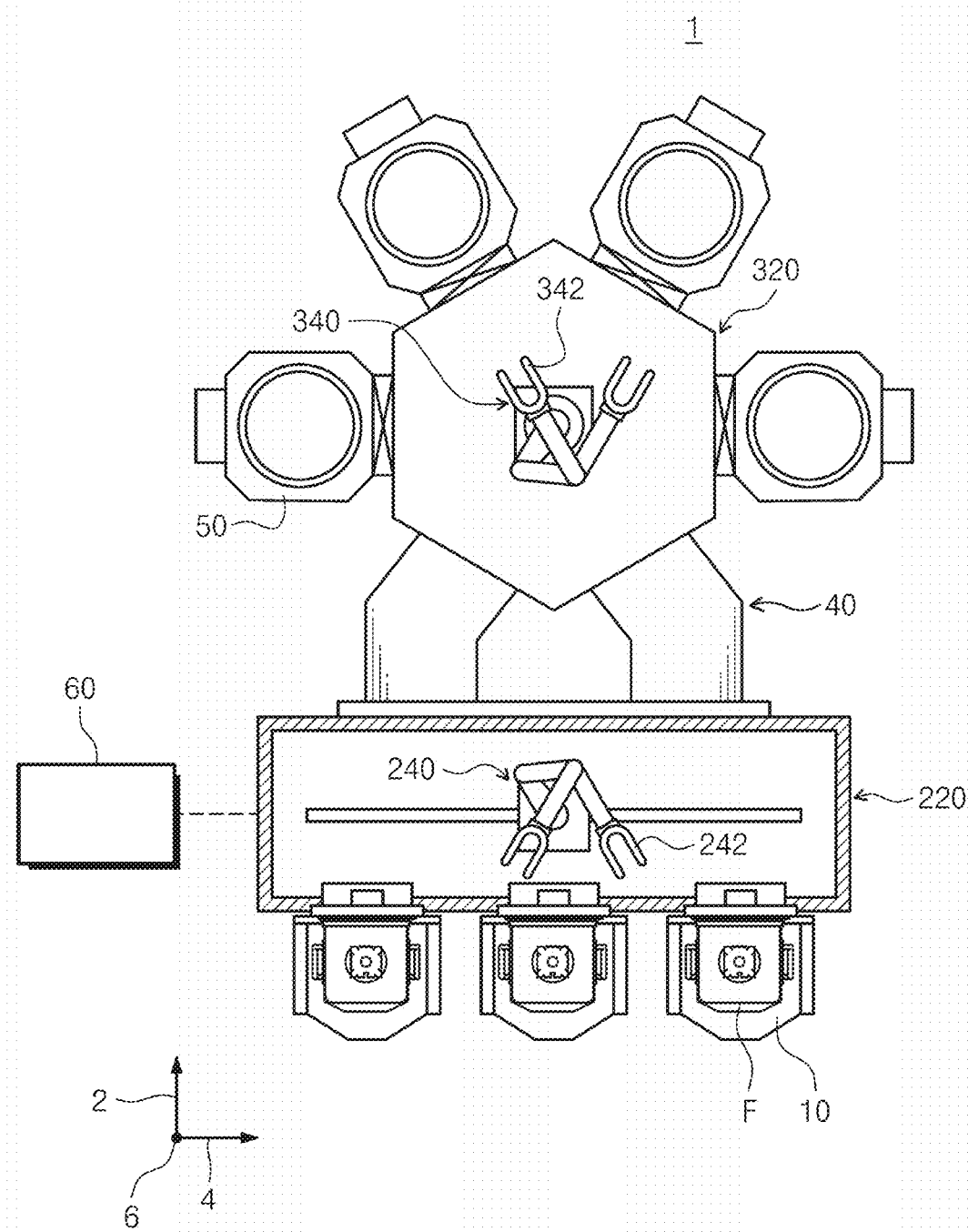
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 11.

FIG. 1 schematically illustrates a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, a process chamber 50, and a controller 60.

The load port 10 may be disposed on a side of the atmospheric pressure transfer module 20 to be described later. One or more load ports 10 may be provided. The number of load ports 10 may increase or decrease according to a process efficiency, foot print conditions, and the like. A container F according to an embodiment of the inventive concept may be placed in the load port 10. The container F may be loaded onto or unloaded from the load port 10 by a transfer means (not shown) such as an overhead transfer apparatus (OHT), an overhead conveyor, or an automatic guided vehicle, or by an operator. The container F may include various types of containers according to a type of an article to be stored. As the container F, an airtight container such as a front opening integrated pod (FOUP) may be used.

The atmospheric pressure transfer module 20 and the vacuum transfer module 30 may be arranged in a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. Here, the third direction 6 is a direction perpendicular to the ground.

The atmospheric pressure transfer module 20 may selectively transfer the substrate W or the ring member R between the container F and the load lock chamber 40 to be described later. For example, the atmospheric pressure transfer module 20 may take out the substrate W from the container F and transfer the substrate W to the load lock chamber 40, or may take out the substrate W from the load lock chamber 40 and transfer the substrate W to the container F. The atmospheric pressure transfer module 20 may include a transfer frame 220 and a first transfer robot 240. The transfer frame 220 may be provided between the load port 10 and the load lock chamber 40. That is, the load port 10 may be connected to the transfer frame 220. The transfer frame 220 may be provided with an atmospheric pressure therein. An inside of the transfer frame 220 may be maintained in an atmospheric pressure atmosphere.

The transfer frame 220 may be provided with a first transfer robot 240. The first transfer robot 240 may selectively transfer the substrate W or the ring member R between the container F seated on the load port 10 and the load lock chamber 40 to be described later.

The first transfer robot 240 may move in a up/down direction. The first transfer robot 240 may have a first transfer hand 242 that moves forwardly, backwardly, or rotates on a horizontal plane. One or a plurality of first transfer hands 242 of the first transfer robot 240 may be provided. The substrate W may be placed on the first transfer hand 242. The first transfer hand 242 may transfer the ring member R. Selectively, a ring carrier (not shown) to be described later supporting the ring member R may be placed on the first transfer hand 242. Selectively, the first transfer hand 242 can directly support the ring member R. However, the inventive concept is not limited thereto, and the ring member R can be placed directly on the first transfer hand 242.

The vacuum transfer module 30 may be disposed between a load lock chamber 40 to be described later and a process chamber 50 to be described later. The vacuum transfer module 30 may include a transfer chamber 320 and a second transfer robot 340.

The transfer chamber 320 may maintain an inner atmosphere as a vacuum pressure atmosphere. The transfer chamber 320 may be provided with a second transfer robot 340. In an embodiment, the second transfer robot 340 may be located in a central area of the transfer chamber 320. The second transfer robot 340 may selectively transfer the substrate W or the ring member R between the load lock chamber 40 and the process chamber 50. Selectively, the vacuum transfer module 30 may transfer the substrate W between the process chambers 50. The second transfer robot 340 may move in a horizontal and vertical direction. The second transfer robot 340 may have a second transfer hand 342 that moves forwardly, backwardly, or rotates on a horizontal plane. At least one second transfer hand 342 of the second transfer robot 340 may be provided.

At least one process chamber 50 to be described later may be connected to the transfer chamber 320. The transfer chamber 320 may be provided in a polygonal shape. A load lock chamber 40 and a process chamber 50 may be disposed around the transfer chamber 320. For example, as shown in FIG. 1, a hexagonal shaped transfer chamber 320 may be disposed at a central area of the vacuum transfer module 30, and a load lock chamber 40 and a process chamber 50 may be disposed around the transfer chamber 320. However, a shape of the transfer chamber 320 and the number of process chambers may be variously modified and provided according to the needs of a user.

The load lock chamber 40 may be disposed between the transfer frame 220 and the transfer chamber 320. The load lock chamber 40 provides a buffer space in which the substrate W or the ring member R is exchanged between the transfer frame 220 and the transfer chamber 320. In an embodiment, to replace the ring member R disposed at the process chamber 50, the ring member R used at the process chamber 50 may temporarily remain at the load lock chamber 40. In an embodiment, in order to transfer a new ring member R scheduled to replace an old ring member R to the process chamber 50, the new ring member R may temporarily remain at the load lock chamber 40.

As mentioned above, an inner atmosphere of the transfer frame 220 may be maintained in an atmospheric pressure atmosphere, and the inner atmosphere of the transfer chamber 320 may be maintained in a vacuum pressure atmosphere. The load lock chamber 40 is disposed between the transfer frame 220 and the transfer chamber 320, so that an inner atmosphere thereof may be converted between the atmospheric pressure atmosphere and a vacuum pressure atmosphere.

The controller 60 may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 60 may control the substrate treating apparatus 1 to perform a substrate treating method described below. For example, the controller 60 may control components provided to the process chamber 50 described later so as to perform the substrate treating method described below.

A plurality of process chambers 50 may be provided. The process chamber 50 may be a chamber that performs a process on the substrate W. The process chamber 50 may be a plasma chamber that treats the substrate W using a plasma. For example, the process chamber 50 may be a chamber performing an etching process of removing a thin film on the substrate W using the plasma, an ashing process of removing a photoresist film, a deposition process of forming a thin film on the substrate W, or a dry cleaning process. However, the inventive concept is not limited thereto, and a plasma treatment process performed at the process chamber 50 may be variously modified to a known plasma treatment process.

Figure 2:
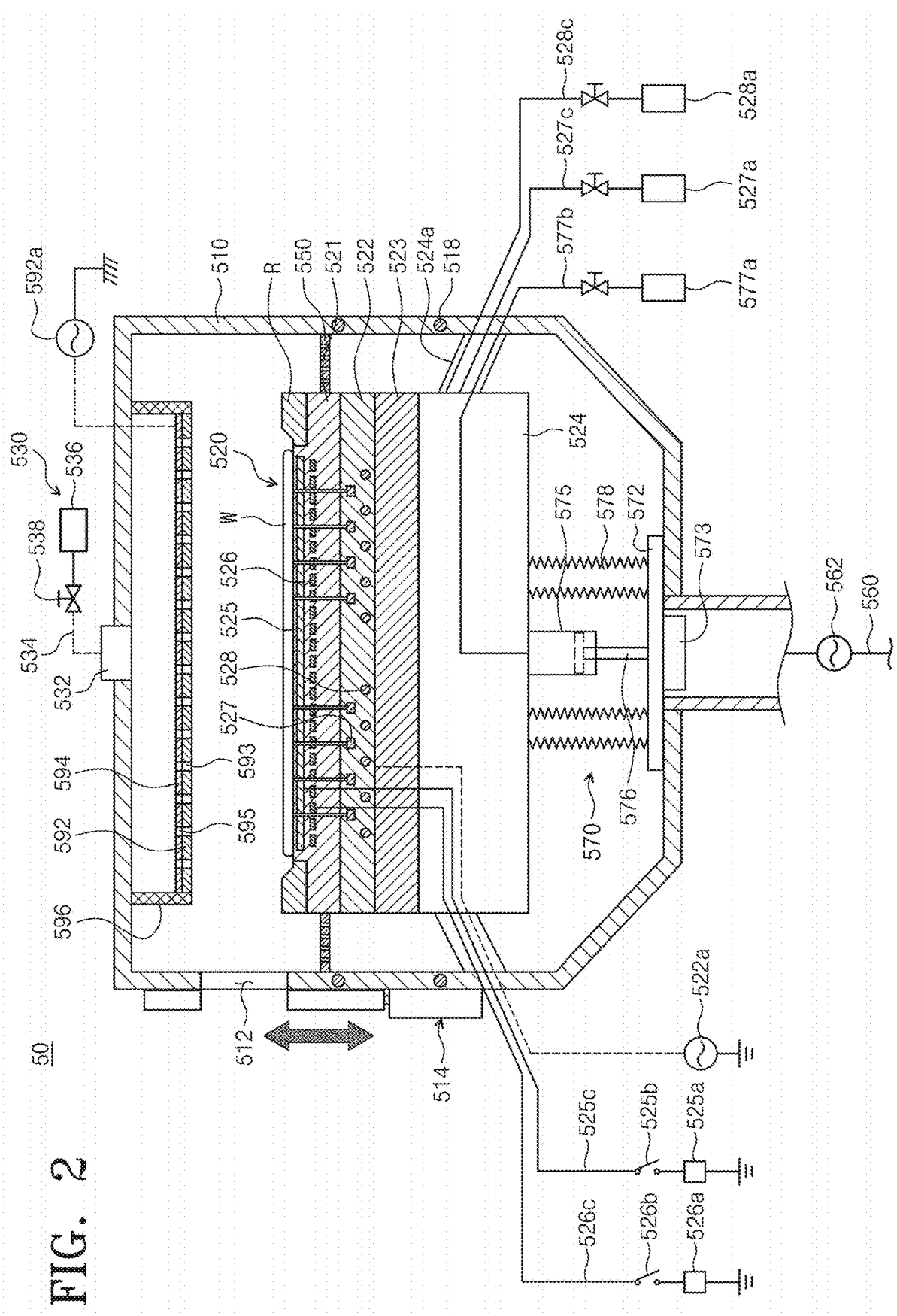
FIG. 2 schematically illustrates an embodiment of a process chamber of FIG. 1.

FIG. 2 schematically illustrates an embodiment of a process chamber of FIG. 1. Referring to FIG. 2, the process chamber 50 may treat a substrate W by transferring a plasma to the substrate W. The process chamber 50 may include a housing 510, a support unit 520, a gas supply unit 530, a plasma source 540, and a pressure adjusting unit 570.

The housing 510 provides a treating space in which a substrate treating is performed therein. The housing 510 may be provided in a sealed shape. The housing 510 may be formed of a metal material. In an embodiment, the housing 510 may be made of an aluminum material. The housing 510 may be grounded. The substrate W and an inlet 512 through which a ring member R is taken in or out may be formed on a side of the housing 510. The inlet 512 may be selectively opened and closed by a gate valve 514. An exhaust hole 516 may be formed at the bottom surface of the housing 510. The exhaust line 560 to be described later may be connected to the exhaust hole 516.

A heater 518 is provided on a wall of the housing 510. The heater 518 heats a wall of the housing 510. The heater 518 is electrically connected to a heating power source (not shown). The heater 518 generates a heat by resisting a current applied from a heating power source (not shown). The heat generated from the heater 518 is transferred to the treating space to maintain the treating space at a predetermined temperature. The heater 518 may be provided as a coil-shaped heating wire. A plurality of heaters 518 may be provided on the wall of the housing 510.

The support unit 520 is located within the housing 510. The support unit 520 may be provided to be upwardly spaced apart from a bottom surface of the housing 510. The support unit 520 supports the substrate W. The support unit 520 includes an electrostatic chuck that adsorbs the substrate W using an electrostatic force. In contrast, the support unit 520 may support the substrate W in various ways such as a vacuum adsorption or a mechanical clamping. Hereinafter, the support unit 520 including the electrostatic chuck will be described.

The support unit 520 may include an electrostatic chuck, an insulating plate 523, a bottom body 524, and a ring member R. The substrate may be mounted on the electrostatic chuck, and a high frequency power may be applied. The electrostatic chuck may include a dielectric plate 521 and an electrode plate 522.

The dielectric plate 521 is located at the top end of the support unit 520. The dielectric plate 521 may be provided as a generally disk-shaped dielectric substance. The substrate W is placed on a top surface of the dielectric plate 521. When seen from above, a diameter of the top surface of the dielectric plate 521 is smaller than that of the substrate W. When the substrate W is placed on the top surface of the dielectric plate 521, an edge area of the substrate W is located outside the dielectric plate 521. An electrode 525 and a heater 526 are buried within the dielectric plate 521.

The electrode 525 may be positioned above the heater 526. The electrode 525 is electrically connected to a first power source 525a. The first power source 525a may include a DC power source. A first switch 525b is installed between the electrode 525 and the first power source 525a. The electrode 525 may be electrically connected to the first power source 525. The electrode 525 may be electrically connected to the first power source 525a by on/off of the first switch 525b. When the first switch 525b is turned on, a DC current is applied to the electrode 525. The electrostatic force acts between the electrode 525 and the substrate W by a current applied to the electrode 525. Accordingly, the substrate W is adsorbed on the dielectric plate 521.

The heater 526 is electrically connected to a second power source 526a. A second switch 526b may be installed between the heater 526 and the second power source 526b. The heater may be electrically connected to the second power source 526a by an on/off of the second switch 526b. The heater 526 generates a heat by resisting a current applied from the second power source 526a. A generated heat is transferred to the substrate W through the dielectric plate 521. The substrate W may be maintained at a predetermined temperature by the heat generated from the heater 526. The heater 526 may include a spiral coil. A plurality of heaters 526 are provided. The heater 526 may be provided in different regions of the dielectric plate 521. For example, a heater 526 for heating a central region of the dielectric plate 521 and a heater 526 for heating an edge region of the dielectric plate 521 may be provided, and the heaters 526 may be independently controlled from each other.

In the above-described example, the heater 526 is provided within the dielectric plate 521, but the inventive concept is not limited thereto, and the heater 526 may not be provided within the dielectric plate 521.

The electrode plate 522 is located under the dielectric plate 521. When seen from above, the electrode plate 522 may be provided in a disk shape. The electrode plate 522 may be made of a conductive material. In an embodiment, the electrode plate 522 may be made of an aluminum material. A top central region of the electrode plate 522 may have an area corresponding to a bottom surface of the dielectric plate 521.

The electrode plate 522 may include a metal plate. According to an embodiment, an entire area of the electrode plate 522 may be provided as a metal plate. The electrode plate 522 may be electrically connected to a third power source 522b. The third power source 525b may be provided as a high frequency power source generating a high frequency power. The high frequency power source may be provided as an RF power source. The RF power source may be provided as a high bias power RF power source. The electrode plate 522 receives the high frequency power from the third power source 522a. For this reason, the electrode plate 522 may function as an electrode. In an embodiment, the electrode plate 522 may function as a bottom electrode. Also, the electrode plate 522 may be provided to be grounded.

A top fluid channel 527 and a bottom fluid channel 528 may be provided within the electrode plate 522. The top fluid channel 527 is provided as a passage through which a heat transfer medium circulates. The top fluid channel may be formed in a spiral shape within the electrode plate 522. The top fluid channel 527 is connected to a first fluid supply source 527a through a first fluid supply line 527c. The heat transfer medium is stored at the first fluid supply source 527a. The heat transfer medium may include an inert gas. In an embodiment, the heat transfer medium may be provided as a helium (He) gas. The helium gas is supplied to the top fluid channel 527 through the first fluid supply line 527c. The helium gas is supplied to a bottom surface of the substrate W through the top fluid channel 527. The helium gas may serve as a medium through which a heat transferred from the plasma to the substrate W is transferred to the dielectric plate 521 and the ring member R.

The bottom fluid channel 528 is provided as a passage through which the heat transfer medium circulates. The bottom fluid channel 528 may be formed in a spiral shape within the electrode plate 522. The bottom fluid channel 528 is connected to a second fluid supply source 528a through the second fluid supply line 528c. The heat transfer medium is stored in the second fluid supply source 528a. The heat transfer medium may be provided as a cooling fluid. In an embodiment, the cooling fluid may be provided as a cooling water. The cooling water is supplied to the bottom fluid channel 528 through the second fluid supply line 528c. The cooling water flows in the bottom fluid channel 528 and may cool the electrode plate 522.

An insulating plate 523 is provided under the electrostatic chuck. An insulating plate 523 is provided under the electrode plate 522. The insulating plate 523 is made of an insulating material, and electrically insulates the electrode plate 522 from a bottom body 524 to be described later. The insulating plate 523 may be provided in a generally circular plate shape when viewed from above. The insulating plate 523 may be provided with an area corresponding to that of the electrode plate 522.

The bottom body 524 is provided under the electrode plate 522. The bottom body 524 may be provided under the insulating plate 523. The bottom body 524 may be provided in a ring shape when viewed from above.

The bottom body 524 has a connecting member 524a. The connecting member 524a connects an outer surface of the bottom body 524 with an inner sidewall of the housing 510. A plurality of connecting members 524a may be provided on the outer surface of the bottom body 524 at regular intervals. The connecting member 524a supports the support unit 520 within the housing 510. The connecting member 524a supports so that the support unit 520 is spaced apart a predetermined distance from the bottom surface of the housing 510.

In addition, the connecting member 524a is connected to the inner sidewall of the housing 510, so that the bottom body 524 is electrically grounded. A first power line 525c connected to the first power source 525a, a second power line 526c connected to the second power source 526a, a first fluid supply line 527d connected to the top fluid channel 527, a second fluid supply line 528c connected to the bottom fluid channel 528, and the like extends to an outside of the housing 510 through an inner space of the connecting member 524a.

A substrate lifting/lowering module (not shown) for lifting and lowering the substrate W and a ring lifting/lowering module (not shown) for lifting and lowering the ring member R may be located in the inner space of the lower body 524. The substrate W may move in a vertical direction between a process position and a transfer position by the substrate lifting/lowering module (not shown). The ring member R may move in the vertical direction between the process position and the transfer position by the ring lifting/lowering module (not shown).

The ring member R is disposed in an edge region of the support unit 520. The ring member R may have a ring shape when viewed from above. The ring member R may have a shape in which a height of an inner top surface is lower than a height of an outer top surface. A bottom surface of an edge region of the substrate W may be placed on the inner top surface of the ring member R. In addition, the ring member R may have an inclined surface upwardly inclined from a center of the substrate W toward an outside of the substrate W between the inner top surface and the outer top surface. For this reason, if the substrate W is placed on the inner top surface of the ring member R, the substrate W may slide along the inclined surface of the ring member R and be placed properly on the inner top surface of the ring member R, even if the position is somewhat inaccurate. Unlike the above-described example, the ring member R according to an embodiment of the inventive concept may be modified and provided in various shapes.

The gas supply unit 530 supplies a process gas to the treating space of the housing 510. The gas supply unit 530 may include a gas supply nozzle 532, a gas supply line 534, and a gas storage unit 536. The gas supply nozzle 532 may be installed in a central area of a top surface of the housing 510. An injection hole is formed on a bottom surface of the gas supply nozzle 532. The injection hole supplies the process gas into the housing 510. The gas supply line 534 connects the gas supply nozzle 532 and the gas storage unit 536. The gas supply line 534 supplies a process gas stored at the gas storage unit 536 to the gas supply nozzle 532. A valve 538 is installed at the gas supply line 534. The valve 538 may adjust a flow rate of the process gas supplied through the gas supply line 534 by opening and closing the gas supply line 534.

The plasma source 540 excites the process gas in the housing 510 into a plasma state. In an embodiment of the inventive concept, a capacitively coupled plasma (CCP) is used as the plasma source. However, the inventive concept is not limited thereto, and the process gas in the housing 510 may be excited in a plasma state by using an inductively coupled plasma (ICP) or a microwave plasma. Hereinafter, a case in which the capacitive coupled plasma (CCP) is used as the plasma source according to an embodiment of the inventive concept will be described as an example.

The capacitively coupled plasma source may include a top electrode and a bottom electrode within the housing 510. The top electrode and the bottom electrode may be vertically disposed parallel to each other within the housing 510. One of both electrodes may apply a high frequency power, and the other electrode may be grounded. Unlike this, both electrodes may apply a high frequency power. An electromagnetic field is formed in a space formed by a combination of both electrodes, and the process gas supplied to the space may be excited in the plasma state. A substrate treatment process is performed using the plasma.

According to an embodiment, the top electrode may be provided as a shower head unit 590 to be described later, and the bottom electrode may be provided as the aforementioned electrode plate 522. A high frequency power may be applied to the top electrode and the bottom electrode, respectively. Alternatively, the high frequency power may be applied to the bottom electrode, and the top electrode may be grounded. For this reason, an electromagnetic field is generated between the top electrode and the bottom electrode. The generated electromagnetic field excites the process gas provided within the housing 510 into the plasma state.

The exhaust baffle 550 uniformly exhausts a plasma flowing in the treating space for each area. The exhaust baffle 550 is located in the treating space. The exhaust baffle 550 is positioned between the housing 510 and the support unit 520. In an embodiment, the exhaust baffle 550 may be positioned between the inner wall of the housing 510 and the outer surface of the support unit 520 in the treating space. The exhaust baffle 550 is positioned above the exhaust hole 516 so that an exhaust with respect to the treating space is more uniformly performed.

The exhaust baffle 550 may have a substantially ring shape when viewed from above. At least one hole is formed in the exhaust baffle 550. In an embodiment, a plurality of holes may be formed in the exhaust baffle 550. The holes formed in the baffle 550 may extend from the top end to the bottom end of the baffle 550. The holes formed in the baffle 550 may be arranged to be spaced apart from each other in a circumferential direction of the baffle 550.

The exhaust line 560 may exhaust an atmosphere of the treating space. The exhaust line 560 may exhaust a process gas or process by-products supplied to the treating space to the outside of the housing 510. The process gas or process by-products supplied to the treating space may be forcibly exhausted from the treating space through the exhaust line 560. The exhaust line 560 is connected to the exhaust hole 516 formed on the bottom surface of the housing 510. An opening/closing valve (not shown) and a depressurizing member 562 may be installed in the exhaust line 560. The opening/closing valve (not shown) may be positioned upstream of the exhaust line 560 from the depressurizing member 562 based on an exhaust direction. The depressurizing member 562 may provide a negative pressure to the treating space. The depressurizing member 562 may be provided in various apparatuses which provide a known sound pressure.

Figure 3:
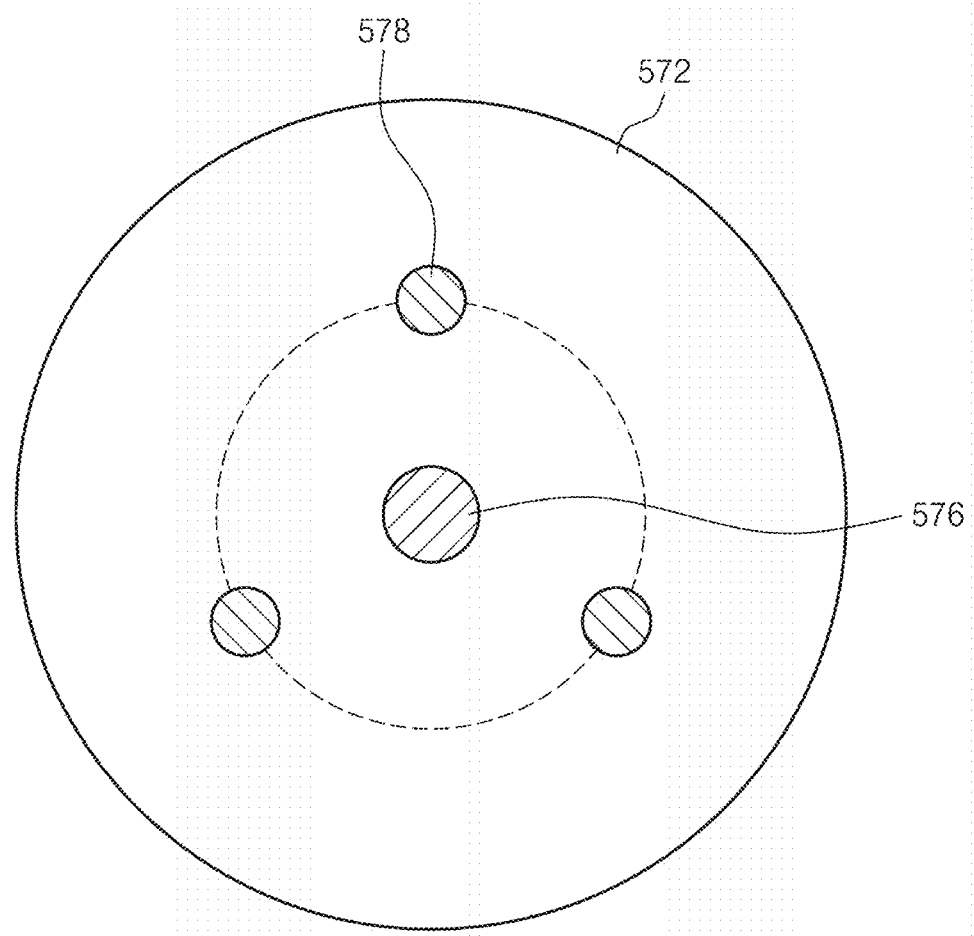
FIG. 3 schematically illustrates a pressure adjusting unit of FIG. 2 from above.

FIG. 3 is a view schematically illustrating the pressure adjusting unit of FIG. 2 as viewed from above. Referring to FIGS. 2 and 3, the pressure adjusting unit 570 adjusts an exhaust pressure exhausted from the exhaust line 560. The pressure adjusting unit 570 may adjust the exhaust pressure exhausted from the exhaust line 560 by opening and closing the opening formed at the top end of the exhaust line 560. For example, the pressure adjusting unit 570 may adjust an exhaust pressure by changing a relative height between the top end of the exhaust line 560 and the bottom end of the opening/closing member 571 to be described later.

The pressure adjusting unit 570 may be disposed inside the housing 510. In an embodiment, the pressure adjusting unit 570 may be positioned between the support unit 520 and the exhaust line 560. According to an embodiment of the inventive concept, the pressure adjusting unit 570 may be fixedly installed at a bottom end of the support unit 520. For example, the body 575 of the lifting/lowering member 574 to be described later may be fixedly installed on a bottom surface of the lower body 524.

The pressure adjusting unit 570 may include an opening/closing member 571, a lifting/lowering member 574, and an elastic member 578. The opening/closing member 571 may open and close the exhaust line 560. The opening/closing member 571 may include a base plate 572 and a stopper member 573.

The base plate 572 may be provided in a substantially circular shape when viewed from above. The base plate 572 may be formed in a substantially disk shape. The base plate 572 may cover the exhaust line 560 when viewed from above. If the base plate 572 is located in a closed position which completely closes the exhaust line 560 by the lifting/lowering member 574, which will be described later, a bottom surface of the base plate 572 may be in contact with the bottom surface of the housing 510. The base plate 572 may be connected to the lifting/lowering member 574. The base plate 572 is vertically movable in a space between a bottom end of the support unit 520 and the top end of the exhaust line 560 by the lifting/lowering member 574. For example, a lifting/lowering rod 576 to be described later may be installed on a top surface of the base plate 572, and may be moved in an upward and downward direction by the lifting/lowering rod 576.

The stopper member 573 is formed to downwardly extend from the bottom end of the base plate 572. The stopper member 573 may be formed in a cylindrical shape. A diameter of the stopper member 573 may be smaller than a diameter of the exhaust line 560. Optionally, the diameter of the stopper member 573 may be the same as the diameter of the exhaust line 560. A height of the stopper member 573 may be less than a height from the bottom end of the support unit 520 to a bottom surface of the housing 510. For example, a vertical height from the top end of the base plate 572 to the bottom end of the stopper member 573 may be less than a vertical height from the bottom end of the support unit 520 to the bottom surface of the housing 510. The base plate 572 and the stopper member 573 may be integrally formed.

The lifting/lowering member 574 moves the opening/closing member 571 in the vertical direction. In an embodiment, the lifting/lowering member 574 may be an actuator. The lifting/lowering member 574 may include a body 575, a lifting/lowering rod 576, and a fluid supply unit 577.

The body 575 has an inner space in which a fluid is stored. The fluid may be stored in the inner space of the body 575. The fluid supplied from the fluid supply unit 577 to be described later may be stored in the inner space of the body 575. The body 575 may be formed in a cylindrical shape. The body 575 may be fixedly installed at the bottom end of the support unit 520. In an embodiment, the body 575 may be installed in a center of the lower body 524. A supply port (not shown) to which the fluid supply line 577b of the fluid supply unit 577 is connected may be formed on a top surface of the body 575.

The lifting/lowering rod 576 is disposed in the inner space of the body 575. The lifting/lowering rod 576 may be a piston. A lengthwise direction of the lifting/lowering rod 576 may be provided substantially perpendicular to the top surface of the base plate 572. The lifting/lowering rod 576 may move up and down in an inner space. The bottom end of the lifting/lowering rod 576 may be coupled to the opening/closing member 571. In an embodiment, the bottom end of the lifting/lowering rod 576 may be coupled to the center of the top end of the opening/closing member 571. The lifting/lowering rod 576 may lift/lower the opening/closing member 571 by vertically moving according to an amount of fluid supplied to the inner space.

The fluid supply unit 577 may supply a fluid to the inner space of the body 575. The fluid supply unit 577 may include a fluid storage unit 577a, a fluid supply line 577b, and an lifting/lowering valve 577c. The fluid storage unit 577a may store a fluid. Various types of liquids or gases may be used as the fluid according to an embodiment of the inventive concept. For example, the fluid stored in the fluid storage unit 577a may be a compressed dry air (CDA).

The fluid supply line 577b connects the fluid storage unit 577a and the inner space of the body 575. In an embodiment, the fluid supply line 577b may connect the fluid storage unit 577a to a supply port (not shown) formed on a top end of the body 575. The fluid may flow from the fluid storage unit 577a to the inner space of the body 575 through the fluid supply line 577b. The fluid supply line 577b extends outside the housing 510 through an inner space of the connection member 524a.

The lifting/lowering valve 577c may be installed in the fluid supply line 577b. The lifting/lowering valve 577c may be provided as an opening/closing valve for opening/closing the fluid supply line 577b. However, the inventive concept is not limited thereto, and the lifting/lowering valve 577c may be provided as a flow rate control valve. If the lifting/lowering valve 577c opens the fluid supply line 577b, the fluid is supplied to the inner space of the body 575. The fluid supplied to the inner space lowers the lifting/lowering rod 576 in a downward direction, and accordingly, the opening/closing member 571 descends. If the lifting/lowering valve 577c closes the fluid supply line 577b, the supply of fluid to the inner space of the body 575 is blocked. By stopping the supply of fluid to the inner space, the lifting/lowering rod 576 moves upward by an elastic force of the elastic member 578 described later, thereby lifting the opening/closing member 571.

The elastic member 578 provides a restoring force to the lifting/lowering member 574. In an embodiment, the elastic member 578 may provide the restoring force to the lifting/lowering member 574 so that the lifting/lowering rod 576 moves upward if the amount of fluid supplied to the inner space of the body 575 is reduced or a supply of the fluid is stopped. In an embodiment, the elastic member 578 may be provided as a bellows. The elastic member 578 may be provided by connecting a plurality of thin metal plates. The elastic member 578 may expand and contract according to a lifting/lowering of the opening/closing member 571 by the lifting/lowering member 574.

The elastic member 578 may be disposed between the support unit 520 and the opening/closing member 571. In an embodiment, an end of the elastic member 578 may be installed at a bottom end of the support unit 520. In addition, the other end of the elastic member 578 may be installed on a top end of the base plate 572. Accordingly, the elastic member 578 may connect the support unit 520 and the opening/closing member 571 to each other.

At least one elastic member 578 may be provided. In an embodiment, a plurality of elastic members 578 may be provided. The plurality of elastic members 578 may be disposed at equal intervals with respect to a central axis of the base plate 572. For example, as shown in FIG. 3, three elastic members 578 may be provided, and the plurality of elastic members 578 may have a same diameter and may be disposed at 120° intervals based on the central axis of the base plate 572. However, the inventive concept is not limited thereto, and an arrangement and spacing of the elastic member 578 may be variously modified as necessary. Since the plurality of elastic members 578 are arranged at equal intervals, the support unit 520 and the opening/closing member 571 may be stably connected to each other. Accordingly, if the opening/closing member 571 moves up and down, the horizontal may be stably maintained.

A shower head unit 590 may include a shower head 592, a gas injection plate 594, and a support unit 596. The shower head 592 may be positioned to be downwardly spaced apart from the top surface of the housing 510 by a predetermined distance. A certain space may be formed between the gas injection plate 594 and the top surface of the housing 510. The shower head 592 may be provided in a plate shape having a constant thickness. A bottom surface of the shower head 592 may be anodized to prevent a generation of an arc due to the plasma. A cross section of the shower head 592 may be provided to have a same form and a cross-sectional area as the support unit 520. The shower head 592 includes a plurality of through holes 593. A through hole 593 penetrates a top surface and the bottom surface of the shower head 592 in the up/down direction. The shower head 592 may include a metal material. The shower head 592 may be electrically connected to a fourth power source 592a. The fourth power source 592a may be provided as a high frequency power source. Alternatively, the shower head 592 may be electrically grounded. In an embodiment, the shower head 592 may function as a top electrode.

The gas injection plate 594 may be located on a top surface of the shower head 592. The gas injection plate 594 may be positioned to be upwardly spaced apart from the top surface of the housing 510 by a predetermined distance. The gas injection plate 594 may be provided in a plate shape having a constant thickness. The gas injection plate 594 is provided with an injection hole 595. The injection hole 595 penetrates the top surface and the bottom surface of the gas injection plate 594 in the up/down direction. The injection hole 595 is positioned opposite the through hole 593 of the shower head 592. The gas injection plate 594 may include a metal material.

A support part 596 supports the side parts of the shower head 592 and the gas injection plate 594. A top end of the support part 596 is connected to the top surface of the housing 510, and a bottom end is connected to a side of the shower head 592 and the gas injection plate 594. The support part 596 may include a non-metallic material.

According to an embodiment of the inventive concept, when viewed from above, the stopper member 573 extending from a bottom end of the base plate 572 and leading into the exhaust line 560 by being provided with a diameter smaller or the same as a diameter of the base plate 572 and the exhaust line 560 which covers the exhaust line 560 is provided in a poppet form. Accordingly, the exhaust line 560 may be completely closed by the base plate 572, and an inner pressure of the treating space exhausted from the exhaust line 560 may be precisely adjusted by the stopper member 573.

According to the above-described embodiment of the inventive concept, the lifting/lowering member 574 is fixedly installed at the bottom end of the support unit 520 and a single lifting/lowering member 574 is provided, thereby solving a structural complexity of the substrate treating apparatus 1.

In addition, according to an embodiment of the inventive concept, the elastic member 578 connects the support unit 520 and the opening/closing member 571 to each other even if the opening/closing member 571 moves up and down, thereby stably maintaining a horizontal position of the opening/closing member 571. A stability of the opening/closing member 571 may be secured. Accordingly, an inner pressure of the treating space exhausted through the exhaust line 560 may be precisely adjusted. In addition, if the fluid is not supplied to the lifting/lowering member 574, or the amount of fluid supplied to the lifting/lowering member 574 decreases, the opening/closing member 571 may be lifted by the elastic force of the elastic member 578.

Figure 4:
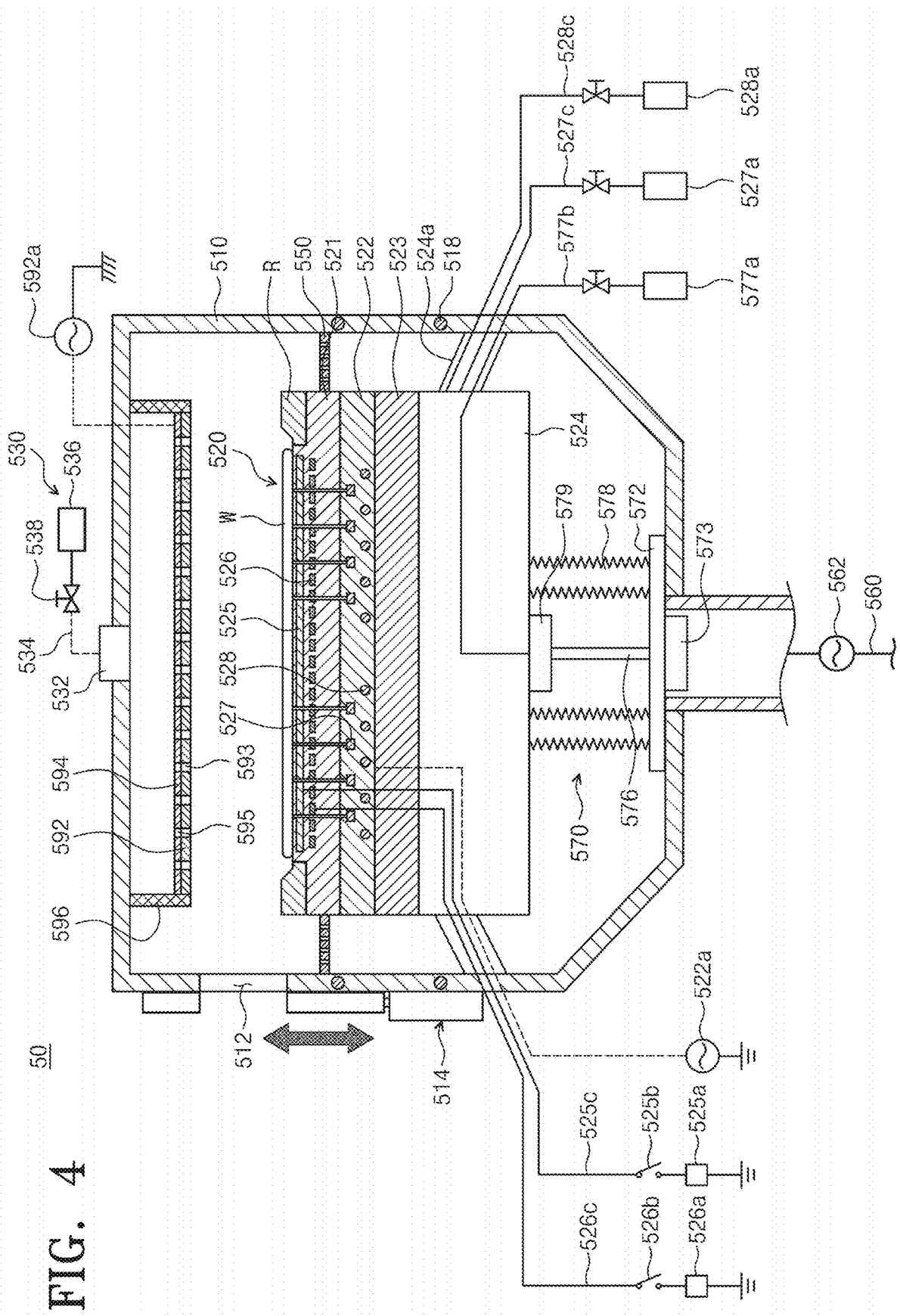
FIG. 4 and FIG. 5 schematically illustrate another embodiment of the process chamber of FIG. 2.
Figure 5:
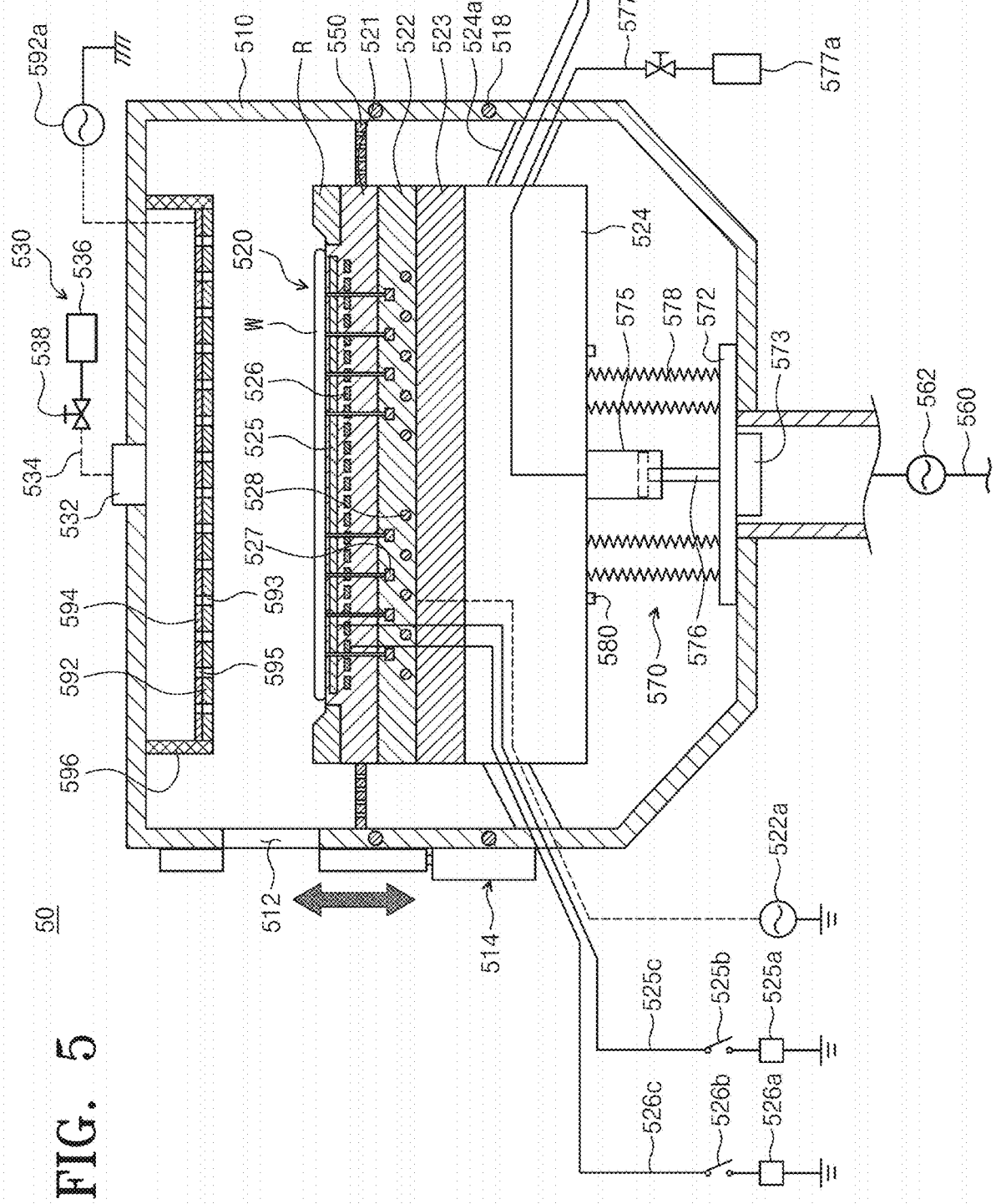

Except for the additional description of the process chamber 50 described below, it is provided similarly to the description of the process chamber 50 described above with reference to FIG. 2 to FIG. 3, and overlapping contents will be omitted for convenience of description. FIG. 4 and FIG. 5 are views schematically illustrating another embodiment of the process chamber of FIG. 2. The pressure adjusting unit 570 according to another embodiment of the inventive concept will be described in detail with reference to FIG. 4 and FIG. 5.

Referring to FIG. 4, the pressure adjusting unit 570 may include an opening/closing member 571, a lifting/lowering member 574, and an elastic member 578. The lifting/lowering member 574 according to an embodiment of the inventive concept moves the opening/closing member 571 in the vertical direction. In an embodiment, the lifting/lowering member 574 may include a lifting/lowering rod 576 and a driving unit 579. The lifting/lowering rod 576 may be coupled to the driving unit 579 to move the opening/closing member 571 in the vertical direction. An end of the lifting/lowering rod 576 may be coupled to the driving unit 579, and the other end of the lifting/lowering rod 576 may be coupled to the base plate 572. The lifting/lowering rod 576 may be formed perpendicular to a top surface of the base plate 572. The driving unit 579 may be coupled to the lifting/lowering rod 576 to lift the base plate 572 in the vertical direction. The driving unit 579 may be provided as a motor. For example, the driving unit 579 may be provided as a BLDC motor (Brushed Less DC motor).

Referring to FIG. 5, the pressure adjusting unit 570 may include an opening/closing member 571, a lifting/lowering member 574, an elastic member 578, and a position sensor 580. The position sensor 580 measures a position information of the opening/closing member 571. In an embodiment, the position sensor 580 may be provided as a laser sensor. However, the inventive concept is not limited thereto, and may be provided as various sensors capable of measuring distance information of a specific member.

The position sensor 580 may be installed at a bottom end of the support unit 520. The position sensor 580 may be installed at a bottom end of the lower body 524. The position sensor 580 may measure a height distance from the bottom end of the support unit 520 to a top end of the opening/closing member 571. For example, the position sensor 580 may measure a vertical distance from the bottom end of the lower body 524 to the top end of the base plate 572. A measured vertical distance data is transmitted to the controller 60 to be described later. The controller 60 may calculate a current height of the opening/closing plate 572 from the vertical distance data. Accordingly, an opening degree of the top opening of the exhaust line 560 may be calculated from a currently positioned height of the opening/closing plate 572.

Hereinafter, a substrate treating method according to an embodiment of the inventive concept will be described in detail. The substrate treating method described below may be performed by the process chamber 50 described above. In addition, the controller 60 may control the components of the process chamber 50 so that the process chamber 50 may perform the substrate treating method described below. For example, the controller 60 may generate a control signal for controlling at least one of the components of the elevation member 578 so that the components of the pressure adjusting unit 570 may perform the substrate treating method described below.

Figure 6:
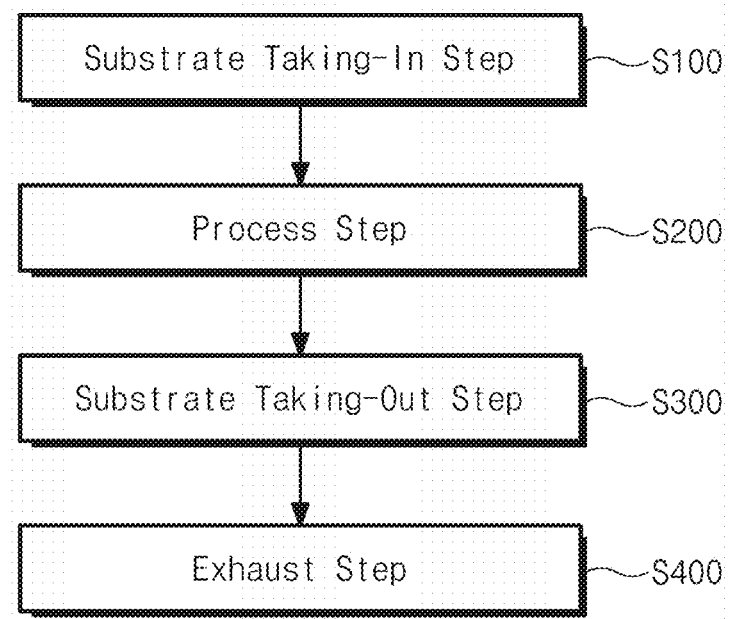
FIG. 6 is a flowchart of a substrate treating method according to an embodiment of the inventive concept.
Figure 7:
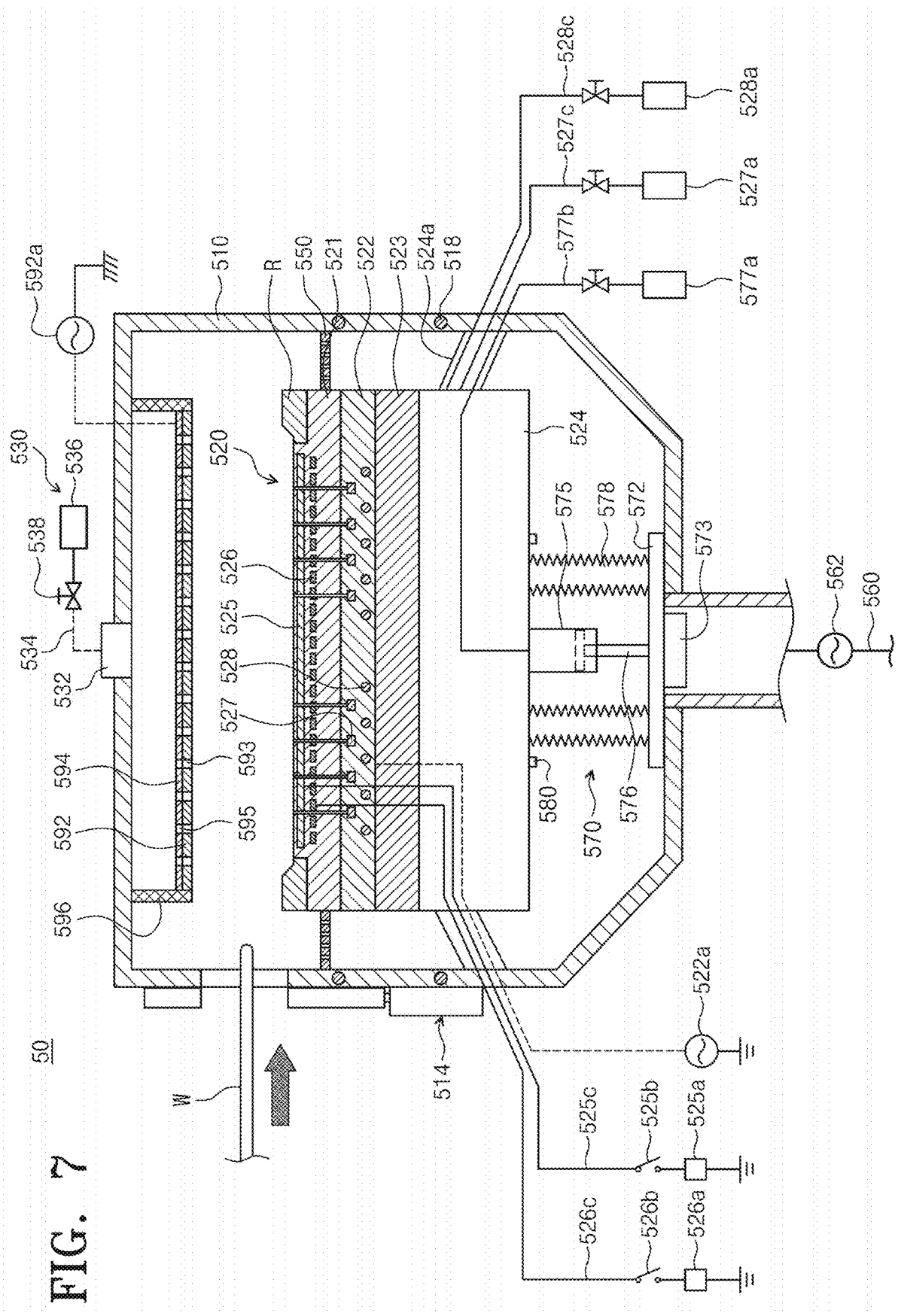
FIG. 7 schematically illustrates a substrate taking-in step of FIG. 6.
Figure 8:
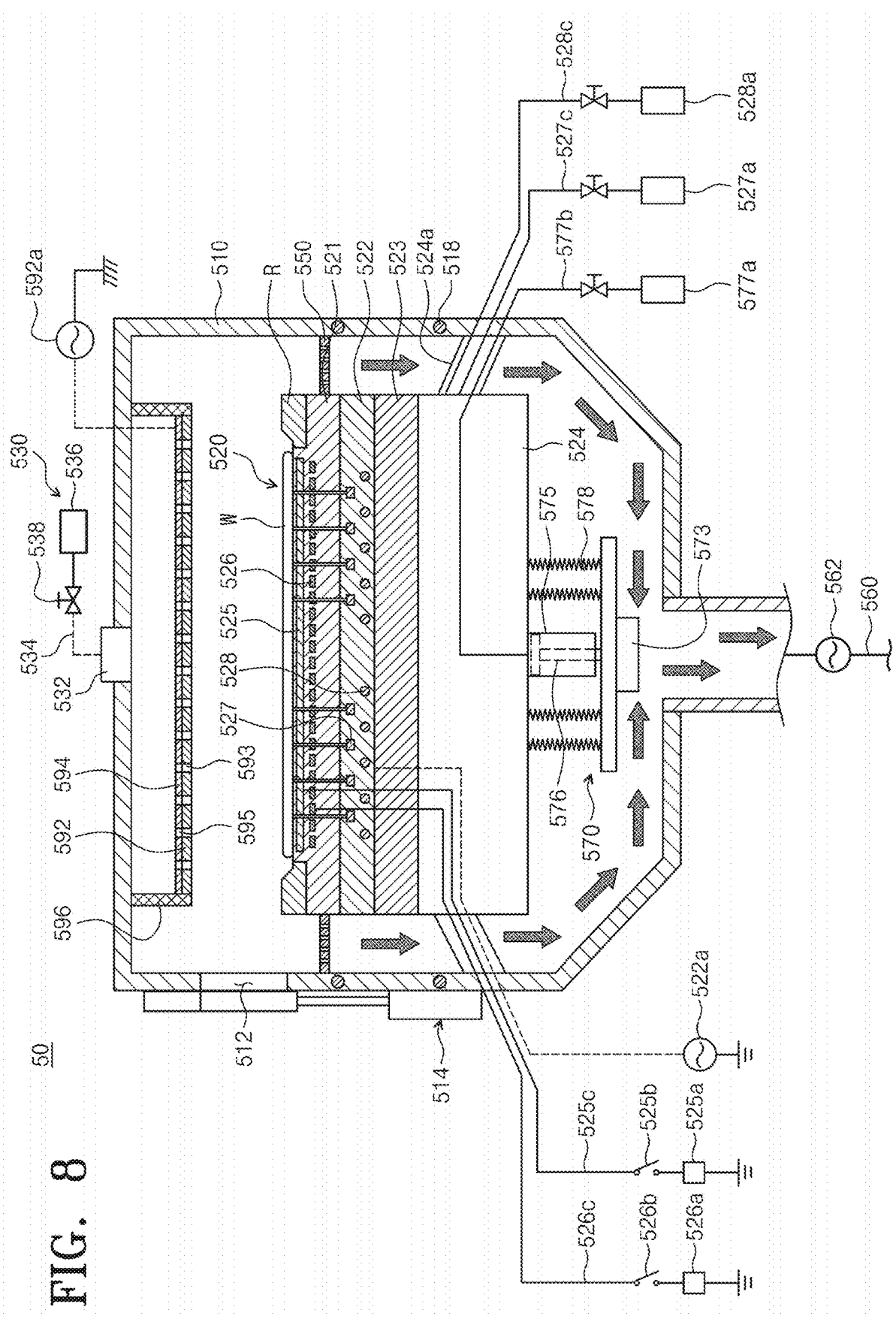
FIG. 8 and FIG. 9 schematically illustrate a state of adjusting an inner pressure of the process chamber in a process step of FIG. 6.
Figure 9:
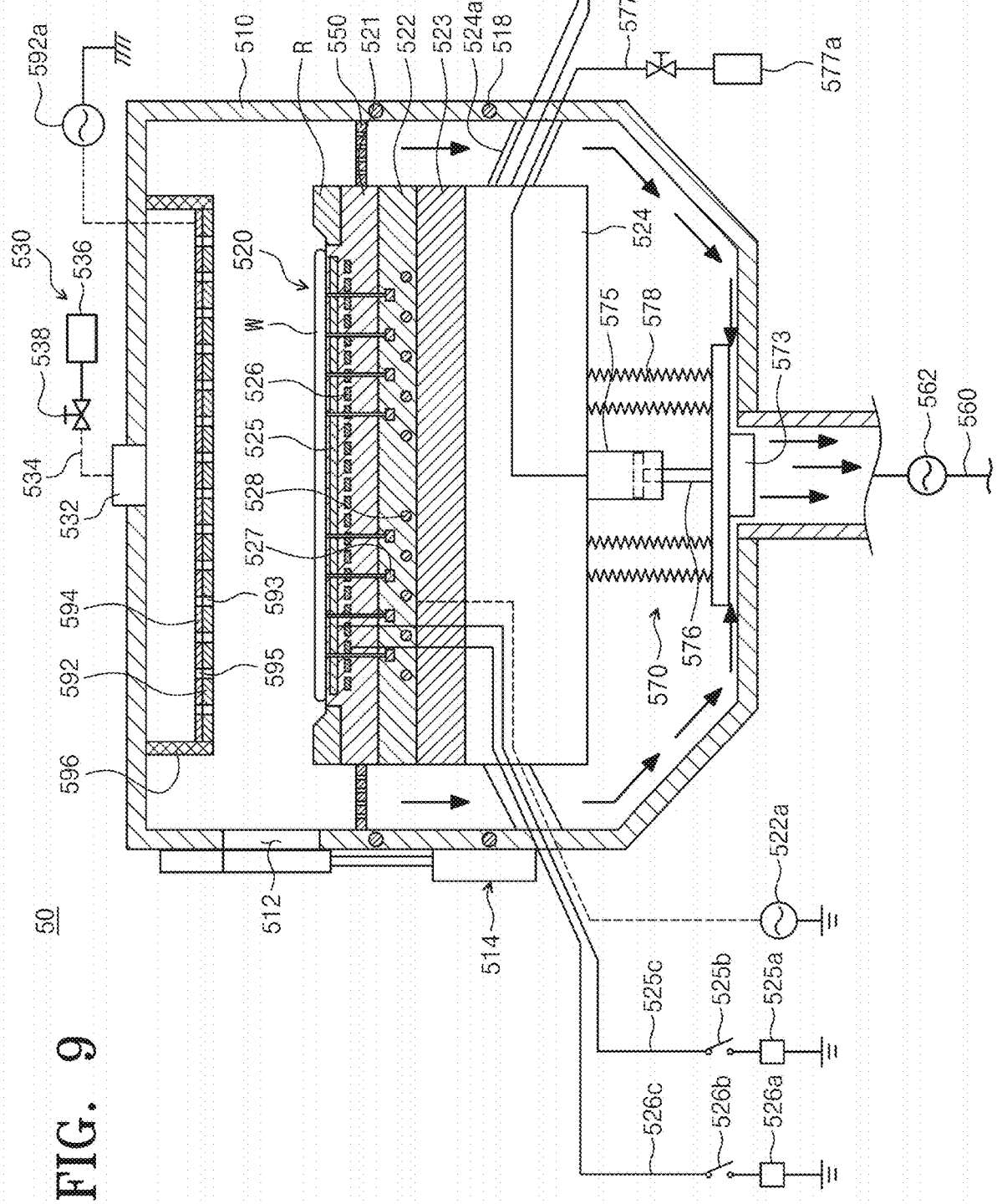
Figure 10:
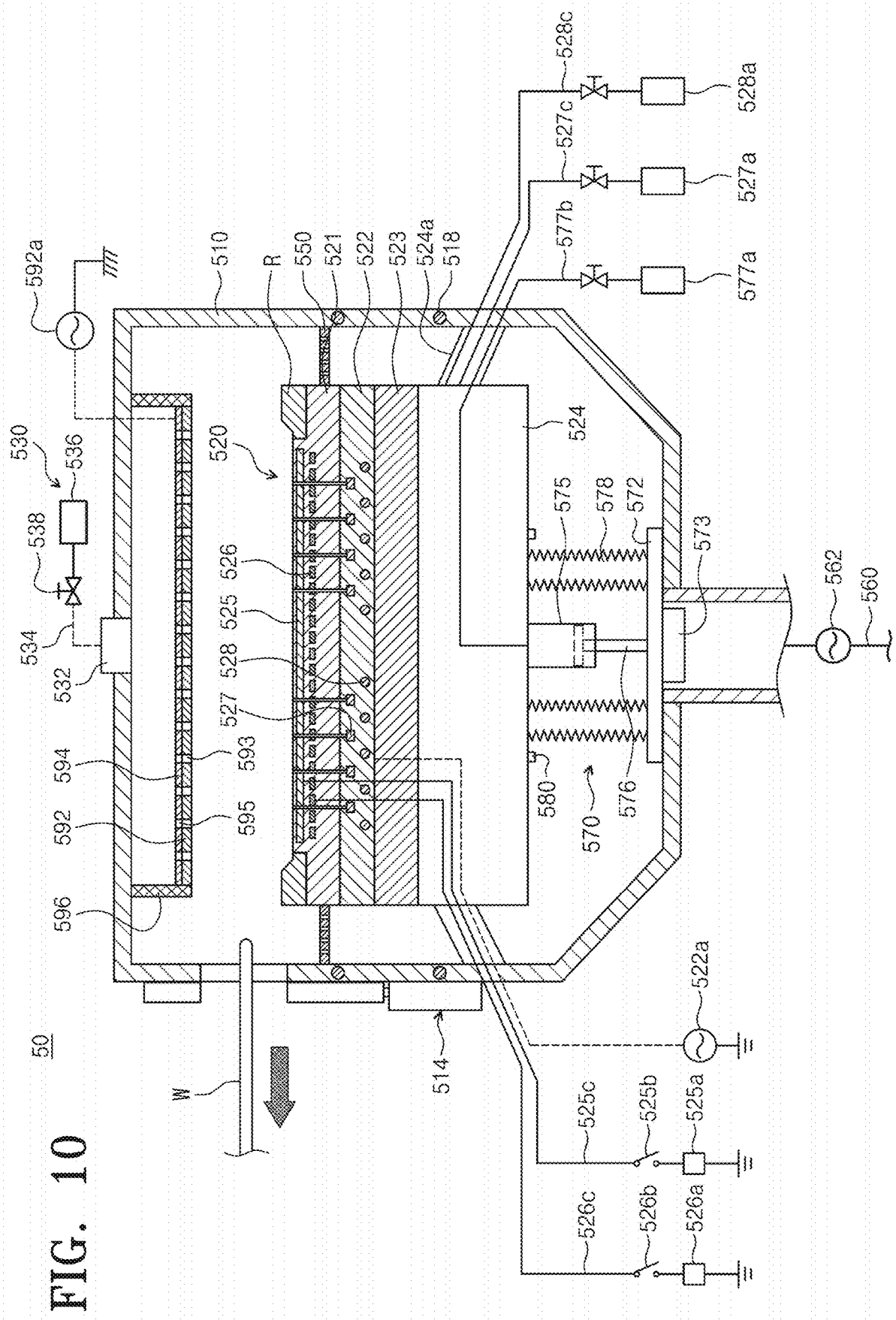
FIG. 10 schematically illustrates the substrate taking-in step of FIG. 6.
Figure 11:
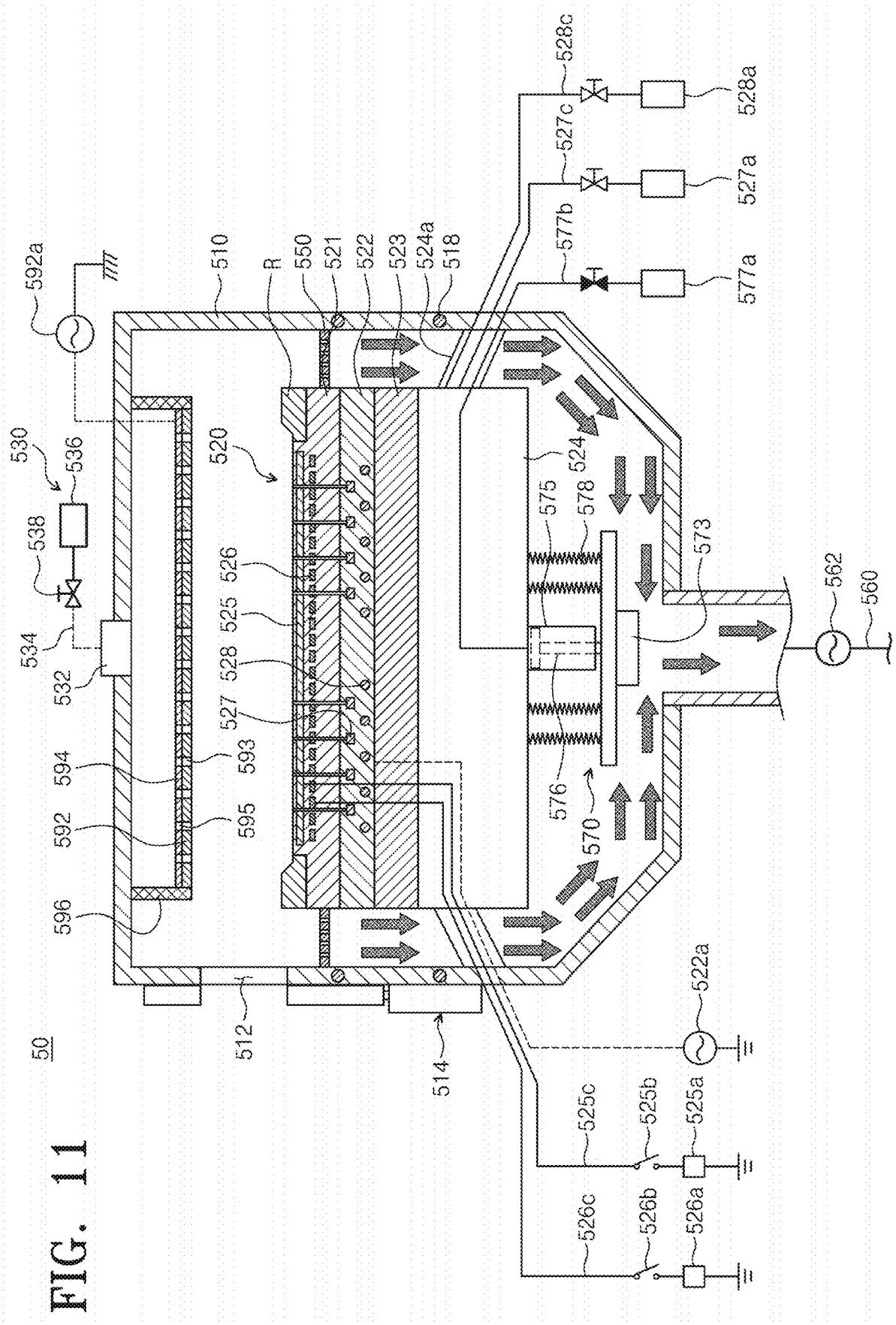
FIG. 11 schematically illustrates an exhaust step of FIG. 6.

FIG. 6 is a flowchart of a substrate treating method according to an embodiment of the inventive concept. FIG. 7 schematically illustrates a substrate taking-in step of the substrate in FIG. 6. FIG. 8 and FIG. 9 schematically illustrating a state of adjusting an inner pressure of the process chamber in a process step of FIG. 6. FIG. 10 schematically illustrates a step of carrying out the substrate of FIG. 6. FIG. 11 schematically illustrates an exhaust step of FIG. 6.

Referring to FIGS. 6 to 11, a substrate treating method according to an embodiment of the inventive concept may include a substrate taking-in step S100, a process step S200, a substrate taking-out step S300, and an exhaust step S400.

Referring to FIG. 7, the substrate taking-in step S100 is a step in which the substrate W is taken into the treating space inside the process chamber 50. In the substrate taking-in step S100, the inlet 512 formed on a side wall of the process chamber 50 is opened by the gate valve 514. In the substrate taking-in step S100, the substrate W is taken into the process chamber 50 through the inlet 512 by the second transfer robot 340. The substrate W taken into the process chamber 50 is placed on the support unit 520. For example, the substrate W taken into the process chamber 50 may be mounted on the top surface of the dielectric plate 521. When the substrate W is seated on the support unit 520, process step S200 is performed.

Referring to FIG. 7, the process step S200 is a step of performing a predetermined treatment on the substrate W. In an embodiment, in the process step S200, a plasma treatment may be performed on the substrate W. In the process step S200, an atmosphere of the treating space may be generally formed as a vacuum. However, the inventive concept is not limited to it, and in the process step S200, the atmosphere of the treating space can be variously adjusted in accordance with the treatment conditions of the substrate W.

In the process step S200, the gate valve 514 closes the inlet 512 formed on a side wall of the process chamber 50 to seal the treating space. In the process step S200, the atmosphere of the treating space may be exhausted. The atmosphere of the treating space is exhausted through the exhaust line 560. In the process step S200, a plasma treatment may be performed on the substrate W while adjusting the inner pressure of the treating space. The inner pressure of the treating space is adjusted by the lifting/lowering member 574. According to an embodiment of the inventive concept, an inner atmosphere of the treating space exhausted through the exhaust line 560 may be adjusted by adjusting an amount of fluid supplied to the lifting/lowering member 574 to adjust a relative height between the bottom end of the base plate 572 and the top end of the exhaust line 560.

In the process step S200, an opening degree of the exhaust line 560 may be calculated based on a current height data of the opening/closing member 571 measured by the position sensor 580. The inner pressure of the treating space of the process chamber 50 may be determined based on the degree of opening of the exhaust line 560. The lifting/lowering member 574 is lifted and lowered according to the inner pressure of the treating space of the process chamber 50 required for treating the substrate W. As the lifting/lowering member 574 lifts and lowers, the opening/closing member 571 lifts and lowers, and an opening degree of the exhaust line 560 is determined.

In an embodiment, as shown in FIG. 8, if it is necessary to reduce the inner pressure of the treating space of the process chamber 50, the lifting/lowering valve 577c is opened and the amount of fluid supplied to the inner space of the body 575 is relatively reduced. Accordingly, the lifting/lowering rod 576 moves upward by the elastic force of the elastic member 578, and the opening/closing member 571 rises. Accordingly, the inner atmosphere of the treating space flowing to the exhaust line 560 is relatively increased, and the inner pressure of the treating space is decreased.

In an embodiment, as shown in FIG. 9, if the inner pressure of the treating space of the process chamber 50 is increased, the lifting/lowering valve 577c is opened, and the supply of the fluid supplied to the inner space of the body 575 is relatively increased, so that the lifting/lowering rod 576 moves downward and the opening/closing member 571 is lowered. As the opening/closing member 571 descends, the stopper member 573 narrows an inner passage providing the exhaust space in the exhaust line 560. Accordingly, the inner atmosphere of the treating space flowing to the exhaust line 560 is relatively reduced, and the inner pressure of the treating space increases.

Referring to FIG. 10, the substrate taking out step S300 is a step of taking out the substrate W from the process chamber 50 after the process step S200 is completed. In the substrate taking-out step S300, the inlet 512 formed on a side wall of the process chamber 50 is opened by the gate valve 514. In the substrate taking-out step S300, the substrate W is taken out of the process chamber 50 through the inlet 512 by the second transfer robot 340.

Referring to FIG. 11, the exhaust step S400 exhausts the atmosphere of the treating space. In the exhaust step S400, various by-products and particles generated in the process step S200 are exhausted through the exhaust line 560. In the exhaust step S400, the inlet 512 formed on a side wall of the process chamber 50 is closed. In the exhaust step S400, the lifting/lowering valve 577c is closed to block the supply of the fluid supplied to the inner space of the body 575. The lifting/lowering member 574 may rise upward by blocking the supply of fluid and by the restoring force of the elastic member 578. Accordingly, the opening/closing member 571 is also lifted in the upward direction. As the opening/closing member 571 is lifted to be spaced apart from the top end of the exhaust line 560, the exhaust line 560 is completely opened. Accordingly, the inner atmosphere of the treating space of the process chamber 50 is exhausted through the exhaust line 560, and accordingly, various by-products or particles flowing in the treating space are exhausted through the exhaust line 560.

According to an embodiment of the inventive concept, when viewed from above, the stopper member 573 extending from a bottom end of the base plate 572 and leading into the exhaust line 560 by being provided with a diameter smaller or the same as a diameter of the base plate 572 and the exhaust line 560 which covers the exhaust line 560 is provided in a poppet form. Accordingly, the exhaust line 560 may be completely closed by the base plate 572, and an inner pressure of the treating space exhausted from the exhaust line 560 may be precisely adjusted by the stopper member 573.

Accordingly, the exhaust line 560 may be completely closed by the base plate 572, and the inner pressure of the treating space exhausted from the exhaust line 560 may be precisely controlled by forming the exhaust path of the exhaust line 560 by the stopper member 573.

According to the above-described embodiment of the inventive concept, the lifting/lowering member 574 is fixedly installed at the bottom end of the support unit 520 and a single lifting/lowering member 574 is provided, thereby solving a structural complexity of the substrate treating apparatus 1.

In addition, according to an embodiment of the inventive concept, the elastic member 578 connects the support unit 520 and the opening/closing member 571 to each other even if the opening/closing member 571 moves up and down, thereby stably maintaining a horizontal position of the opening/closing member 571. A stability of the opening/closing member 571 may be secured. Accordingly, the inner pressure of the treating space exhausted through the exhaust line 560 may be precisely adjusted. In addition, if the fluid is not supplied to the lifting/lowering member 574, or the amount of fluid supplied to the lifting/lowering member 574 decreases, the opening/closing member 571 may be lifted by the elastic force of the elastic member 578.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate treating apparatus comprising:
a housing having a treating space for treating a substrate;
a support unit configured to support the substrate at the treating space;
a plasma source for generating a plasma from a process gas supplied into the treating space;
an exhaust line connecting to the housing and exhausting an atmosphere of the treating space; and
a pressure adjusting unit positioned between the support unit and the exhaust line and configured to adjust an exhaust pressure exhausted from the exhaust line, wherein the pressure adjusting unit comprises,
an opening/closing member for opening and closing the exhaust line;
a lifting/lowering member for moving the opening/closing member in an up/down direction; and
an elastic member for providing a restoring force to the lifting/lowering member,
wherein the opening/closing member comprises,
a base plate formed to cover the exhaust line when seen from above; and
a stopper member extending from a bottom end of the base plate and having a diameter which is same or smaller than a diameter of the exhaust line, and
wherein the elastic member connects a bottom end of the support unit and a top end of the base plate.

2. The substrate treating apparatus of claim 1, wherein the elastic member is provided in a plurality, and the plurality of elastic member are positioned at regular intervals based on a center of the base plate.

3. The substrate treating apparatus of claim 1, wherein the lifting/lowering member is installed at a center of the opening/closing member.

4. A substrate treating apparatus, comprising:
a housing having a treating space for treating a substrate;
a support unit configured to support the substrate at the treating space;
a plasma source for generating a plasma from a process gas supplied into the treating space;
an exhaust line connecting to the housing and exhausting an atmosphere of the treating space; and
a pressure adjusting unit positioned between the support unit and the exhaust line and configured to adjust an exhaust pressure exhausted from the exhaust line,
wherein the pressure adjusting unit comprises,
an opening/closing member for opening and closing the exhaust line;
a lifting/lowering member for moving the opening/closing member in an up/down direction; and
an elastic member for providing a restoring force to the lifting/lowering member,
wherein the lifting/lowering member comprises,
a body combined to a bottom end of the support unit, having an inner space, and storing a fluid in the inner space;
a lifting/lowering rod having an end combining with the opening/closing member and moving in the up/down direction due to the fluid of the inner space; and
a fluid supply unit configured to supply the fluid to the inner space,
wherein the apparatus further comprises a controller for controlling the lifting/lowering member,
wherein the controller controls the lifting/lowering member so a relative height between the opening/closing member and a top end of the exhaust line is changed by an adjusting of a supply amount of the fluid supplied to the inner space,
wherein the controller controls the lifting/lowering member to supply the fluid to the inner space, if the opening/closing member moves in a downward direction, and
controls the lifting/lowering member so the elastic member provides the restoring force to the lifting/lowering member by stopping a supply of the fluid in the inner space, if the opening/closing member moves in an upward direction.

5. The substrate treating apparatus of claim 4, wherein the pressure adjusting unit further comprises a position sensor installed at the bottom end of the support unit and measuring a position information of the opening/closing member by measuring a height from the bottom end of the support unit to a top end of the opening/closing member, and
wherein the controller controls the lifting/lowering member so a relative height between a bottom end of the opening/closing member and the top end of the exhaust line is changed based on an opening degree of the exhaust line, which is measured by a height of the opening/closing member measured by the position sensor.

6. A substrate treating apparatus comprising:
a housing having a treating space for treating a substrate;
a support unit configured to support the substrate at the treating space;
a gas supply unit configured to supply a process gas to the treating space;
a plasma source for exciting a plasma from the process gas;
an exhaust line connecting to a bottom end of the housing and exhausting an atmosphere of the treating space; and
a pressure adjusting unit positioned between the support unit and the exhaust line and configured to adjust an exhaust pressure exhausted from the exhaust line, and
wherein the pressure adjusting unit comprises,
an opening/closing member for opening and closing the exhaust line;
a lifting/lowering member for moving the opening/closing member in an up/down direction; and
an elastic member for providing a restoring force to the lifting/lowering member, and
wherein the opening/closing member comprises,
a base plate formed to cover the exhaust line when seen from above; and
a stopper member extending from a bottom end of the base plate and having a diameter which is the same or smaller than a diameter of the exhaust line, and
wherein the elastic member connects a bottom end of the support unit and a top end of the base plate.

7. The substrate treating apparatus of claim 6, wherein the elastic member is provided in a plurality, and positioned at regular intervals based on a center of the base plate.

8. The substrate treating apparatus of claim 7, wherein the lifting/lowering member comprises:
a body combined to the bottom end of the support unit, having an inner space, and storing a fluid in the inner space;
a lifting/lowering rod having an end combining with the opening/closing member and moving in the up/down direction due to the fluid of the inner space; and
a fluid supply unit configured to supply the fluid to the inner space.

9. The substrate treating apparatus of claim 8, wherein the apparatus further comprises a controller for controlling the lifting/lowering member, and
wherein the pressure adjusting unit further comprises a position sensor installed at the bottom end of the support unit and measuring a position information of the opening/closing member by measuring a height from the bottom end of the support unit to a top end of the opening/closing member, and
wherein the controller controls the lifting/lowering member so a relative height between a bottom end of the opening/closing member and a top end of the exhaust line is changed based on an opening degree of the exhaust line, which is measured by a height of the opening/closing member measured by the position sensor.

10. The substrate treating apparatus of claim 9, wherein the controller controls the lifting/lowering member to supply the fluid to the inner space, if the opening/closing member moves in a downward direction, and
controls the lifting/lowering member so the elastic member provides the restoring force to the lifting/lowering member by stopping a supply of the fluid in the inner space, if the opening/closing member moves in an upward direction.

\* \* \* \* \*